(12) United States Patent
Nikaido et al.

(10) Patent No.: US 7,635,268 B2
(45) Date of Patent: Dec. 22, 2009

(54) IC SOCKET AND IC PACKAGE MOUNTING DEVICE

(75) Inventors: Shinichi Nikaido, Sakura (JP); Haruo Miyazawa, Yotsukaido (JP); Katsuya Yamagami, Narashino (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/781,052

(22) Filed: Jul. 20, 2007

(65) Prior Publication Data
US 2008/0032521 A1    Feb. 7, 2008

(30) Foreign Application Priority Data
Jul. 21, 2006    (JP) .............................. 2006-199538

(51) Int. Cl.
*H01R 12/00*    (2006.01)
(52) U.S. Cl. ........................................ 439/66
(58) Field of Classification Search ................... 439/66, 439/73, 700, 71, 862, 68–69, 330–331, 219, 439/482, 824
See application file for complete search history.

(56) References Cited

U.S. PATENT DOCUMENTS

| | | | |
|---|---|---|---|
| 5,366,380 A | * | 11/1994 | Reymond .................... 439/66 |
| 6,821,131 B2 | * | 11/2004 | Suzuki et al. ................. 439/73 |
| 7,052,284 B2 | * | 5/2006 | Liao et al. .................... 439/66 |
| 7,338,294 B2 | * | 3/2008 | Polnyi .......................... 439/66 |
| 2003/0040201 A1 | * | 2/2003 | Ishizuka et al. ............... 439/66 |
| 2007/0099445 A1 | * | 5/2007 | Li ................................ 439/70 |

FOREIGN PATENT DOCUMENTS

| | | |
|---|---|---|
| JP | 8-203644 A | 8/1996 |
| JP | 2002-14113 A | 1/2002 |
| JP | 2004-39564 A | 2/2004 |
| JP | 2004-158430 A | 6/2004 |
| JP | 2005-19284 A | 1/2005 |

* cited by examiner

*Primary Examiner*—Edwin A. Leon
(74) *Attorney, Agent, or Firm*—Sughrue Mion, PLLC

(57) ABSTRACT

An IC socket includes a plurality of contacts each including a spring formed by winding a conductive material around a winding axis with an effective winding number of at least 1 round, and arms provided on both ends of the spring, and a housing including the same number of holes as the plurality of contacts, the holes each having one of the contacts inserted therein in a state in which the spring is compressed in a direction of the winding axis so as to allow adjacent coil portions in the spring to come into contact with each other and to be electrically conductive.

20 Claims, 12 Drawing Sheets

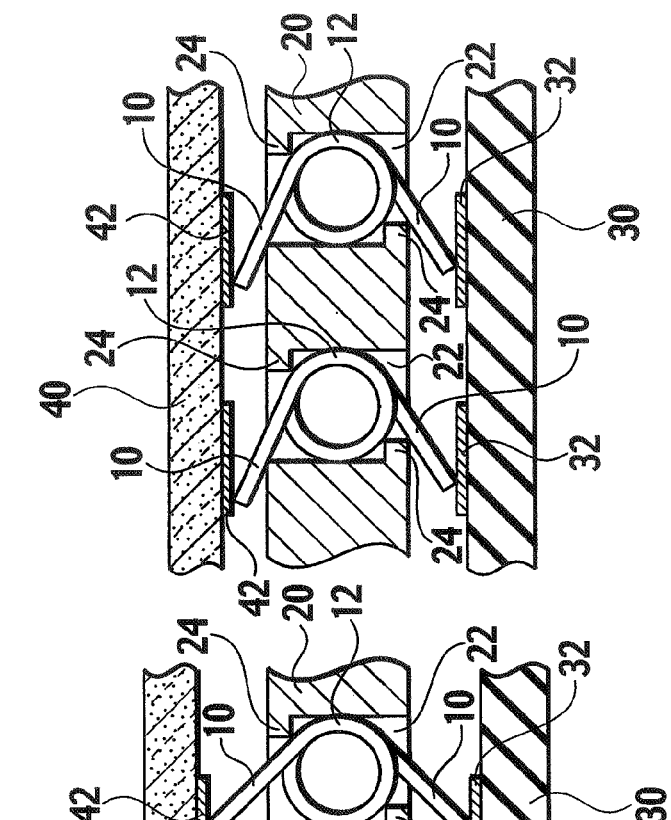
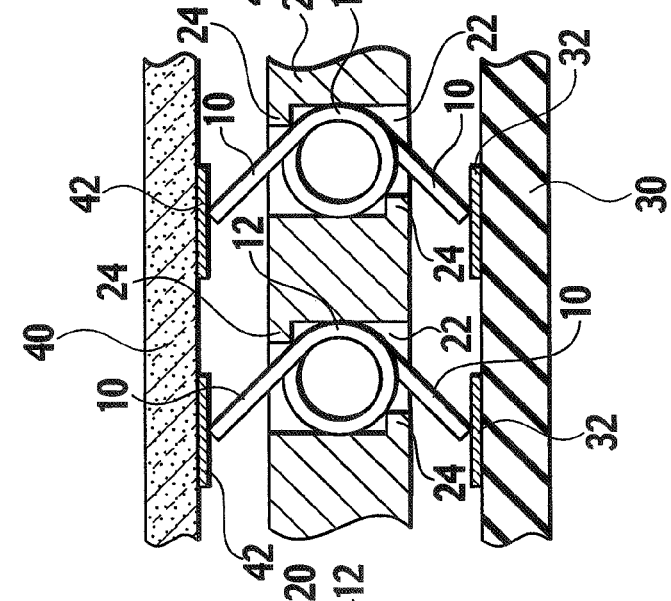
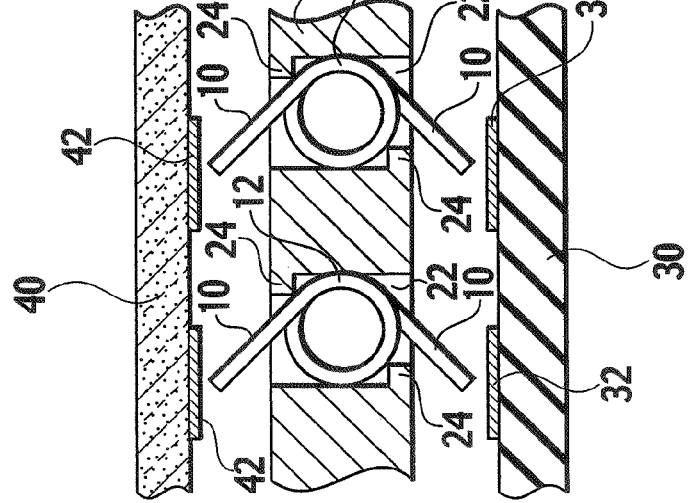

IC SOCKET AND IC PACKAGE MOUNTING DEVICE

CROSS REFERENCE TO RELATED APPLICATIONS

This application is based upon and claims the benefit of priority from the prior Japanese Patent Application No. P2006-199538, filed on Jul. 21, 2006; the entire contents of which are incorporated herein by reference.

BACKGROUND OF THE INVENTION

1. Field of the Invention

The present invention relates to an integrated circuit (IC) socket and, more specifically, to an IC socket and an IC package mounting device used for mounting an IC package onto a printed circuit board.

2. Description of the Related Art

Techniques for mounting an IC package such as a central processing unit (CPU) or a large scale integrated circuit (LSI) onto a printed circuit with a socket have long been studied. IC sockets for mounting CPUs in land grid array (LGA) packages or ball grid array (BGA) packages are embedded in many personal computers and mother boards.

To improve functions and performances of CPUS, the number of pins and the processing speed have been increasing. With the increase in the number of pins and the processing speed of CPUS, IC packages have been improved to have a larger size and finer pitch and IC sockets have also been improved similarly, in order to support such CPUs having an increased number of pins. The increase in size of an IC package for supporting the increased number of pins increases the flexible volume of the IC package and variations in the height of contact lands and balls thereof. Accordingly, an IC socket also needs to correspond to these increases, and is required to have a structure capable of securing contact strokes of the IC socket. Meanwhile, support for the finer pitch should be achieved with the simplest structure possible, and a desirable structure is one in which an IC package is connected to a printed circuit board at a short distance. Moreover, for the increase in the speed of a CPU, it is important that a contact has low inductance. Here, it is also expected to achieve a high allowable current in response to an increase in a consumption current attributable to the higher speed.

The mainstream of a socket for a LGA package today is one corresponding to 400 to 800 pins at a pitch of about 1 mm with a structure in which given shapes of contacts are formed by intricately bending a metal plate, so that the contacts are inserted into a housing of the IC socket.

However, the structure configured to insert the contacts into the housing of the IC socket employs plate springs. Accordingly, when the lengths of springs are increased to increase strokes of the IC contacts, the springs may touch neighboring pins. In other words, the IC socket has a problem that it is not possible to increase the contact strokes as the pitch becomes finer.

As a countermeasure for increasing contact strokes even in the case of a finer pitch, there is a disclosure in which torsion springs are used for contacts. When torsion springs are used for contacts, it is possible to adjust various parameters such as a wire diameter, an average winding radius, an effective winding number or an arm length in order to achieve required moment and strokes within an allowable stress range determined by a material. Accordingly, the torsion springs provide more design freedom than the simple plate springs and are likely to meet required mechanical characteristics.

Nevertheless, as for an electric characteristic in the case of using the torsion spring as the contact, the torsion spring may be an obstacle to high-speed operation of an IC due to high inductance caused by a coiled structure of the torsion spring.

SUMMARY OF THE INVENTION

An aspect of the present invention inheres in an IC socket includes a plurality of contacts each including a spring formed by winding a conductive material around a winding axis with an effective winding number of at least 1 round, and arms provided on both ends of the spring, and a housing including the same number of holes as the plurality of contacts, the holes each having one of the contacts inserted therein in a state in which the spring is compressed in a direction of the winding axis so as to allow adjacent coil portions in the spring to come into contact with each other and to be electrically conductive.

Another aspect of the invention inheres in an IC package mounting device includes an IC package, a printed circuit board configured to mount the IC package, and an IC socket which includes, a plurality of contacts each including a spring formed by winding a conductive material around a winding axis with an effective winding number of at least 1 round, and arms provided on both ends of the spring, and a housing having the same number of holes as the plurality of contacts, the holes each having one of the contacts inserted therein in a state in which the spring is compressed in a direction of the winding axis so as to allow adjacent coil portions of the spring to come into contact with each other and to be electrically conductive, and which the IC socket is disposed between the IC package and the printed circuit board to connect the IC package to the printed circuit board through the contacts.

BRIEF DESCRIPTION OF DRAWINGS

FIGS. 7A to 7C are process sectional views showing a fitting operation of the IC socket according to the first embodiment of the present invention.

DETAILED DESCRIPTION OF EXEMPLARY EMBODIMENTS OF THE INVENTION

Figure 1A:
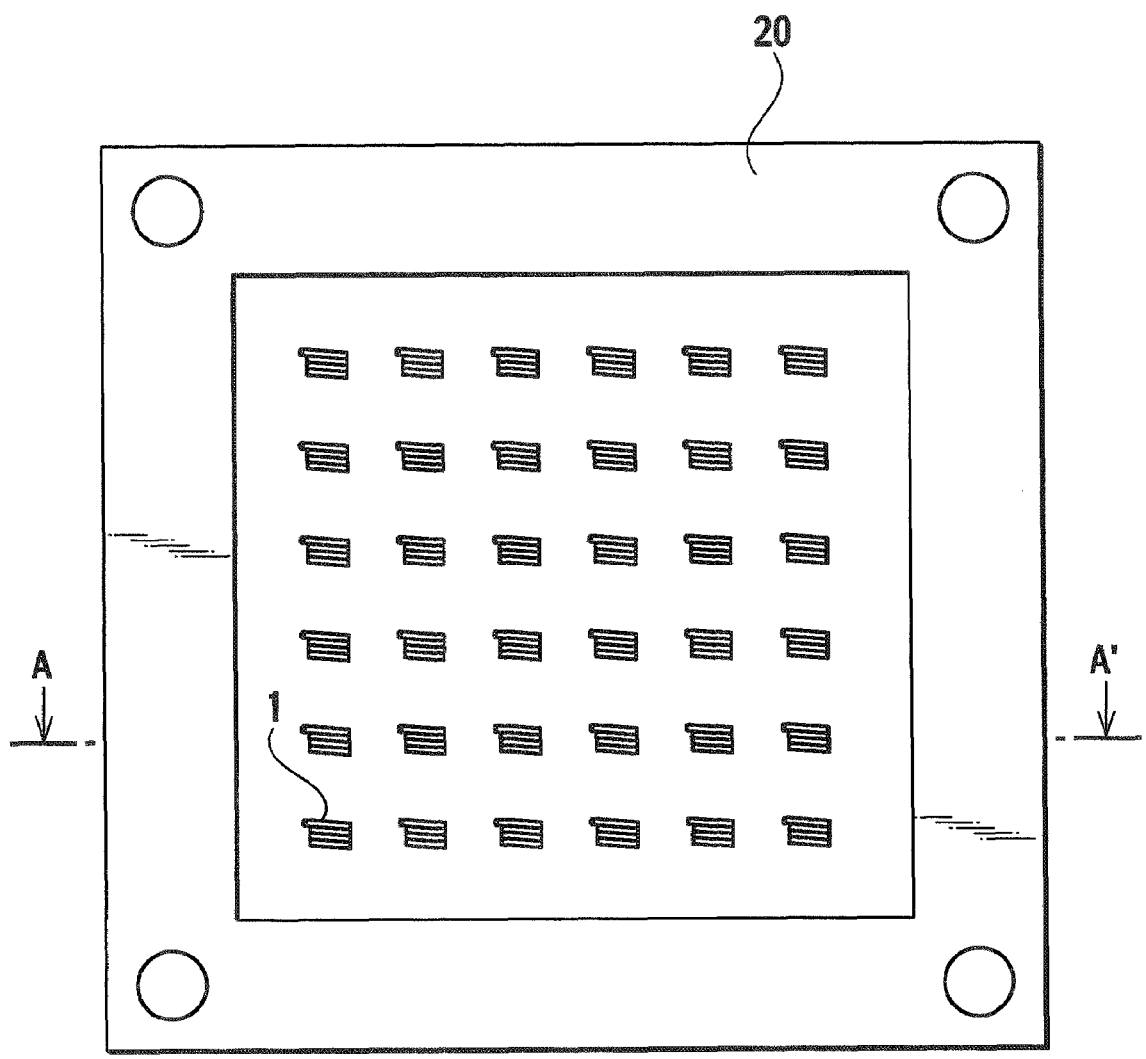
FIG. 1A is a schematic plan view of an integrated circuit (IC) socket according to a first embodiment of the present invention and FIG. 1B is a schematic cross-sectional view of the IC socket according to the first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details.

First Embodiment

Figure 1B:
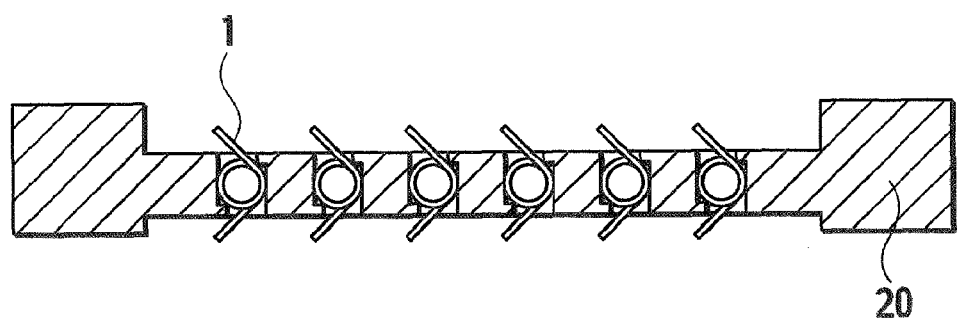

As shown in FIGS. 1A and 1B, an integrated circuit (IC) socket according to a first embodiment of the present invention includes multiple contacts 1 and a housing 20 provided with the same number of holes as the multiple contacts 1. FIG. 1B is a cross-sectional view taken along the A-A' line in FIG. 1A.

Figure 2A:
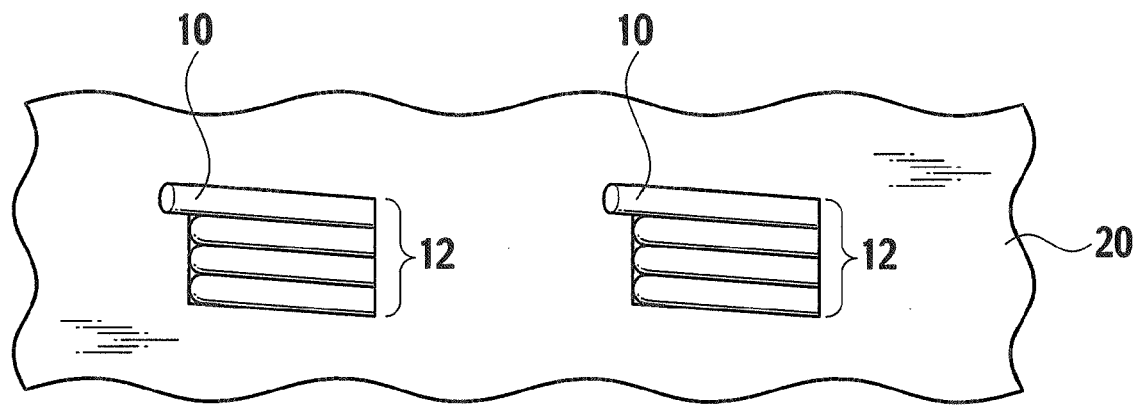
FIG. 2A is a partially enlarged view of a portion of FIG. 1A
Figure 2B:
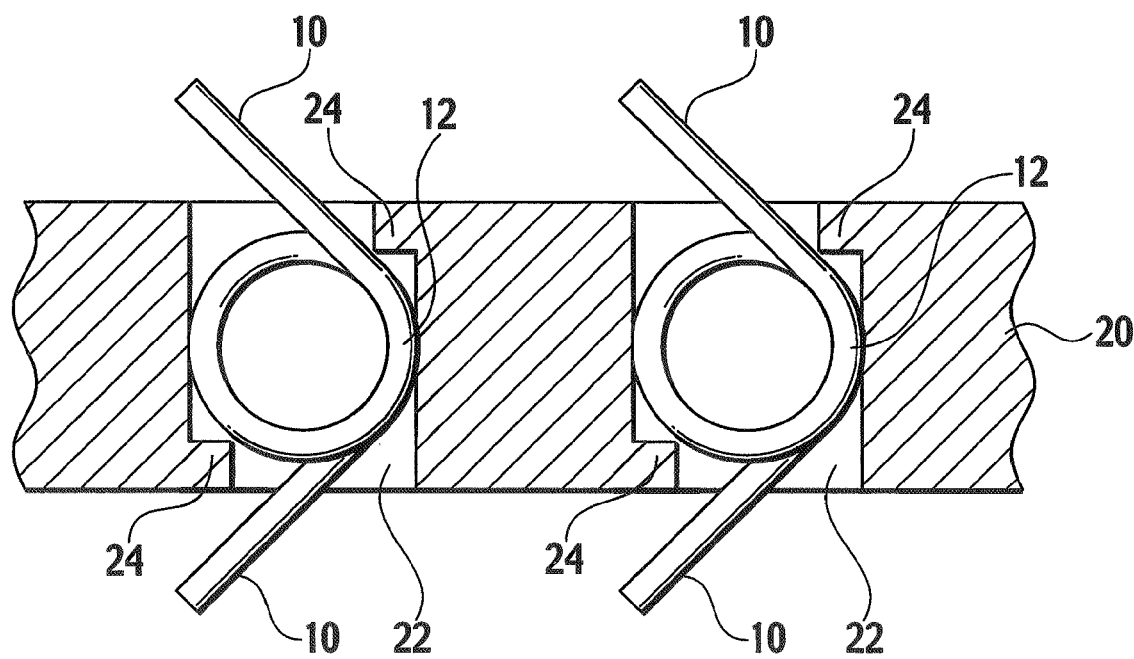
FIG. 2B is a partially enlarged view of a portion of FIG. 1B.
Figure 3A:
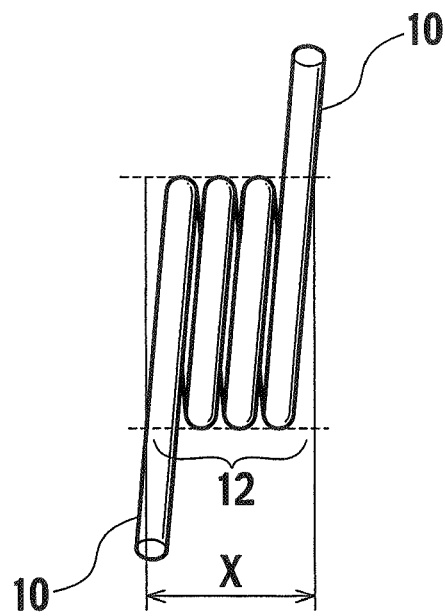
FIGS. 3A and 3B are views for explaining compression of a contact according to the first embodiment of the present invention.
Figure 3B:
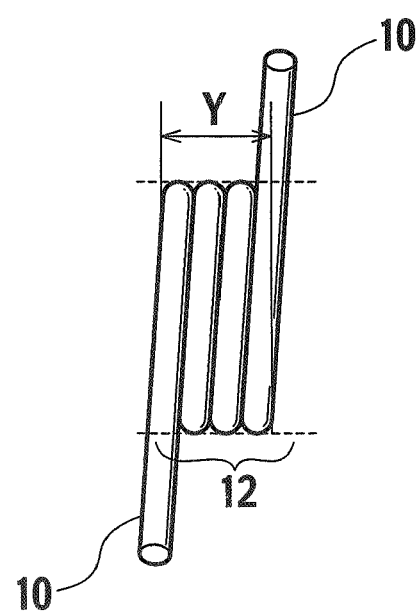
Figure 4A:
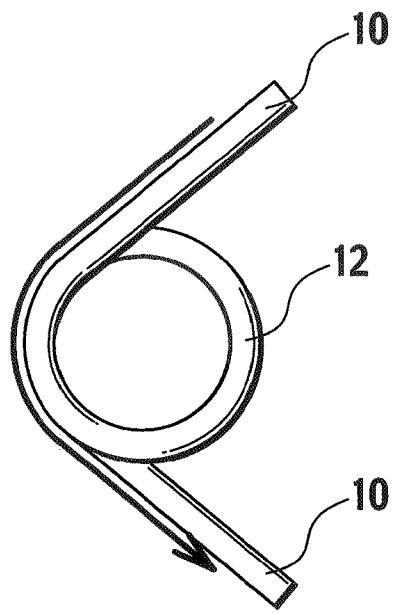
FIGS. 4A and 4B are first explanatory views for showing a conductive path of the contact according to the first embodiment of the present invention.
Figure 4B:
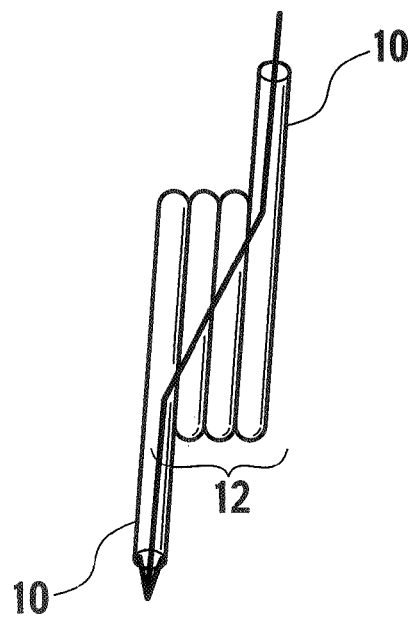

As shown in FIGS. 2A and 2B, each contact 1 includes a spring 12 formed by winding a conductive material around a winding axis with an effective winding number of at least 1 round, and arms 10 provided on both ends of the spring 12. A length of the spring 12 in a direction of the winding axis is equal to a length X in a normal uncompressed state as shown in FIG. 3A. Meanwhile, the length of the spring 12 is equal to a length Y in a compressed state as shown in FIG. 3B. When the spring 12 is compressed to the length Y, a conductive path of electricity becomes the shortest distance from one side of the arms 10 to the other side of the arm 10 as indicated with arrows in FIGS. 4A and 4B. When the spring 12 is not compressed to the length Y, the electricity is conducted along the windings of the spring 12 and inductance is therefore increased.

A calculated value of inductance L' of the contact 1 in the state where the spring 12 is not compressed to the length Y (for example, the not compressed state shown in FIG. 3A) will be shown below. The inductance L' of the contact 1 in the state where the spring 12 is not compressed to the length Y is equal to the sum of inductance L1 and inductance L2 of the arms 10, which is expressed by:

$$L' = L1 + L2 \quad (1)$$

Figure 5A:
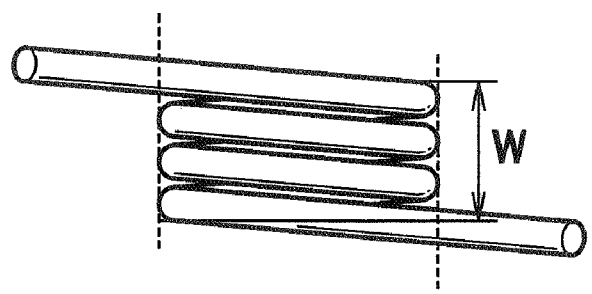
FIGS. 5A and 5B are second explanatory views for showing a conductive path of the contact according to the first embodiment of the present invention.
Figure 5B:
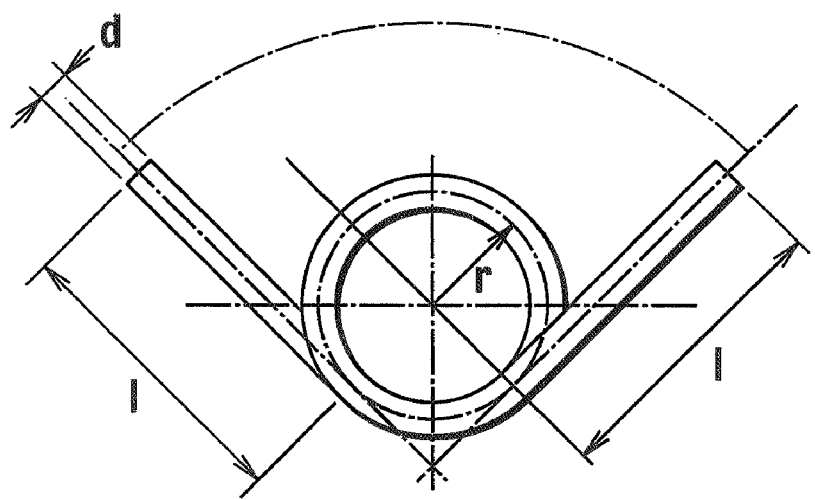

Assuming that an average winding radius of the spring 12 is r, the effective winding number is N, a width of a coil (the spring 12) is W, magnetic permeability of air is $\mu_0$, and a Nagaoka coefficient is K with reference to FIGS. 5A and 5B, the inductance L1 of the spring is expressed by:

$$L1 = (K \cdot \mu_0 \cdot \pi \cdot r^2 \cdot N^2)/W \quad (2)$$

Meanwhile, assuming that a wire diameter of the arm 10 is d and a length of the arm 10 is 1 with reference to FIG. 5B, the inductance L2 of the arms 10 is expressed by:

$$L2 = \mu_0 \cdot 1/2 \cdot [\log(4 \cdot 1/d) - 3/4] \quad (3)$$

Here, when the average winding radius r of $2.5 \times 10^{-4}$ m, the effective winding number N of 3.0, the width of a coil W of $6.4 \times 10^{-4}$ m, the magnetic permeability of air $\mu_0$ of $1.3 \times 10^{-6}$ Hm, and the Nagaoka coefficient K of $7.1 \times 10^{-1}$ are assigned to the equation (2) as a specific example, the inductance L1 is calculated as 2.5 nH. Moreover, when the magnetic permeability of air $\mu_0$ of $1.3 \times 10^{-6}$ Hm and the wire diameter d of $2.0 \times 10^{-4}$ m are assigned to the equation (3) as the specific example, the inductance L2 is calculated as 0.34 nH. The inductances L1 and L2 figured out from the equations (2) and (3) are assigned to the equation (1), and the inductance L' is calculated as 208 nH. In recent years, the inductance allowed as a specification of an IC socket is around 1.0 nH. Given that the inductance L1 of the spring 12 made of the torsion spring is equal to 2.5 nH by assigning the values in this specific example to the calculating formula, it is apparent that the inductance L1 of the spring 12 of the torsion spring becomes a problem.

Figure 6A:
FIGS. 6A and 6B are third explanatory views for showing a conductive path of the contact according to the first embodiment of the present invention.
Figure 6B:
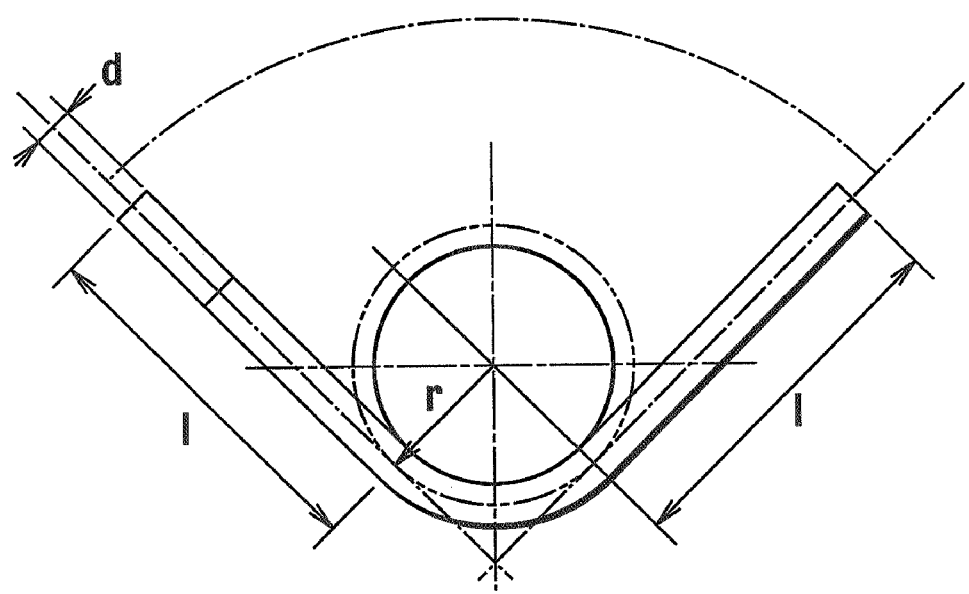

Next, inductance L of the contact 1 in the case of compressing the spring 12 to meet the length Y as shown in FIG. 3B will be calculated. When compressing the spring 12 to meet the length Y, the conduction of the contact 1 can disregard the coil portion as indicated with the arrows in FIGS. 4A and 4B. Accordingly, a model for calculating the inductance L becomes as shown in FIGS. 6A and 6B. That is, in this case, it is only necessary to consider straight line portions constituting the arms 10 and a curve portion of the spring 12 without considering the coil portion 12 of the spring. Therefore, the inductance L of the contact 1 when compressing the spring 12 to meet the length Y is expressed by:

$$L = \mu_0 \cdot 1/2 \cdot [\log(4 \cdot (1 + 2r\pi \cdot N/d) - 3/4] \quad (4)$$

Here, when the same values assigned for obtaining the above-described inductance L', namely, the magnetic permeability of air $\mu_0$ of $1.3 \times 10^{-6}$ Hm, the average winding radius r of $2.5 \times 10^{-4}$ m, the Nagaoka coefficient K of $7.1 \times 10^{-1}$, and the wire diameter d of $2.0 \times 10^{-4}$ m are assigned to the equation (4) as a specific example, the inductance L is calculated as 0.43 nH. This value satisfies the inductance allowed as a specification of an IC socket in recent years. Such an effect of reducing the inductance only requires the condition that the coil portions of the spring 12 come into contact with each other and is therefore conductive in the shortest distance. In other words, this portion does not have to be fixed. Therefore, the contact 1 can work as the torsion spring from the mechanical perspective and can achieve required moment and strokes by adjusting the effective winding number, the length of the arms 10, the wire diameter, and the average winding radius.

As for the contact 1, it is possible to use a metal material such as a copper alloy or stainless steel, or a resilient nonmetal material such as rubber or synthetic resin for metal plating to obtain conductivity. The metal plating process may be copper (Cu) plating, nickel (Ni) plating, gold (Au) plating, or the like. Moreover, when Ni/Au plating formed by plating Au on a Ni-plated surface is used, it is possible to increase mechanical strength with the Ni plating and to enhance conductivity while reducing contact resistance with the Au plating.

When manufacturing the contact 1, the effect of the plating varies depending on the geometry of the contact 1. Here, effects of the plating that vary depending on the geometry of the contact 1 in the plating process will be described below.

In a first method, the plating process is executed when the contact 1 is still a wire rod. In short, this is the method of executing the plating process before forming the spring 12 into the spring shape. In this case, since the entire wire rod is plated, the coil portions of the spring 12 that come into contact with each other when compressing the spring 12 is plated in the state of the wire rod before forming the spring 12. This is advantageous in reduction of the inductance. However, as the plating process takes place in the form of the wire rod, cut surfaces after forming the contact 1 are not plated and an additional countermeasure is required.

In a second method, the plating process is executed after forming the spring 12 of the contact 1 and processing tip end shapes. Since the finished contact 1 is subjected to plating, the cut surfaces on the tip ends are also plated. However, since the plating process is executed after winding the wire rod to form the spring 12, it is difficult to plate efficiently on the coil portions of the spring 12 that come into contact with each other when compressing the spring 12. Therefore, it is necessary to find a way to secure uniform plating.

In a third method, the plating process is executed when the contact 1 is still a wire rod, then the spring 12 of the contact 1 is formed and another plating process is executed after processing the tip end shapes. According to this method, it is possible to achieve sufficient plating on the cut surfaces on the tip ends as well as the coil portions that come into contact with each other when compressing the spring 12, and thereby to ensure the performance. However, the additional plating process incurs additional works and costs.

A cross-sectional shape of the contact 1 is preferably formed into a circle or a rectangle. By forming the contact 1 having the circular or rectangular cross-sectional shape, it is easier to form the torsion spring.

As shown in FIGS. 2A and 2B, the housing includes contact insertion holes 22, each of which is configured to allow insertion of the contact 1 in the state such that the spring 12 is compressed in a direction of a winding axis so as to cause the coil portions of the spring 12 to come into contact with each other and thereby to achieve the conduction in the shortest distance. The width of the contact insertion hole 22 is designed to an appropriate width for compressing the spring 12 of the contact 1 and for allowing the coil portions of the spring 12 to come into contact with each other to achieve the conduction in the shortest distance. It is preferable to provide stoppers 24 in the form of protrusions inside the contact hole 22 so as to prevent the inserted contact 1 from dropping off.

A typical method of inserting the contact 1 into the contact insertion hole 22 is to deform the contact 1 within an allowable range of elastic deformation and then to push the contact 1 into the contact insertion hole 22. Alternatively, there is another method to split the housing 20 vertically and to combine the spilt pieces of the housing 20 together after placing the contact 1 therebetween.

Next, a fitting operation of the IC socket according to the first embodiment of the present invention will be described with reference to FIGS. 7A to 7C.

First, as shown in FIG. 7A, the IC socket is disposed between an IC package 40 such as a CPU or a LSI and a printed circuit board 30 for mounting the IC package 40. The printed circuit board 30 further embeds electronic components including resistors and capacitors, and constitutes an electronic circuit by connecting those electronic components. Next, as shown in FIG. 7B, the arms 10 on the IC socket are allowed to contact terminals (lands) 32 of the printed circuit board 30 and terminals (lands) 42 of the IC package 40, by narrowing a clearance between the printed circuit board 30 and the IC package 40. Next, as shown in FIG. 7C, the tip ends of the arms 10 on the IC socket are allowed to scrape and move on the lands 32 of the printed circuit board 30 and on the lands 42 of the IC package 40, by further narrowing the clearance between the printed circuit board 30 and the IC package 40. At this time, the tip ends of the arms 10, the surfaces of the lands 32 of the printed circuit boards 30 and the surfaces of the lands 42 of the IC package 42 scrape one another. Accordingly, it is possible to obtain a wiping effect to remove oxide films formed on the surfaces of the lands 32 and 42. By the wiping effect, fresh metal surfaces can contact each other every time of fitting the IC socket. Therefore, it is possible to keep the contact resistance low. Moreover, in the state shown in FIG. 7C where the IC socket is completely fitted, angles of the arms 10 are deformed and moments are generated as a consequence. These moments bring about contact pressure and strokes necessary for fitting.

Figure 8:
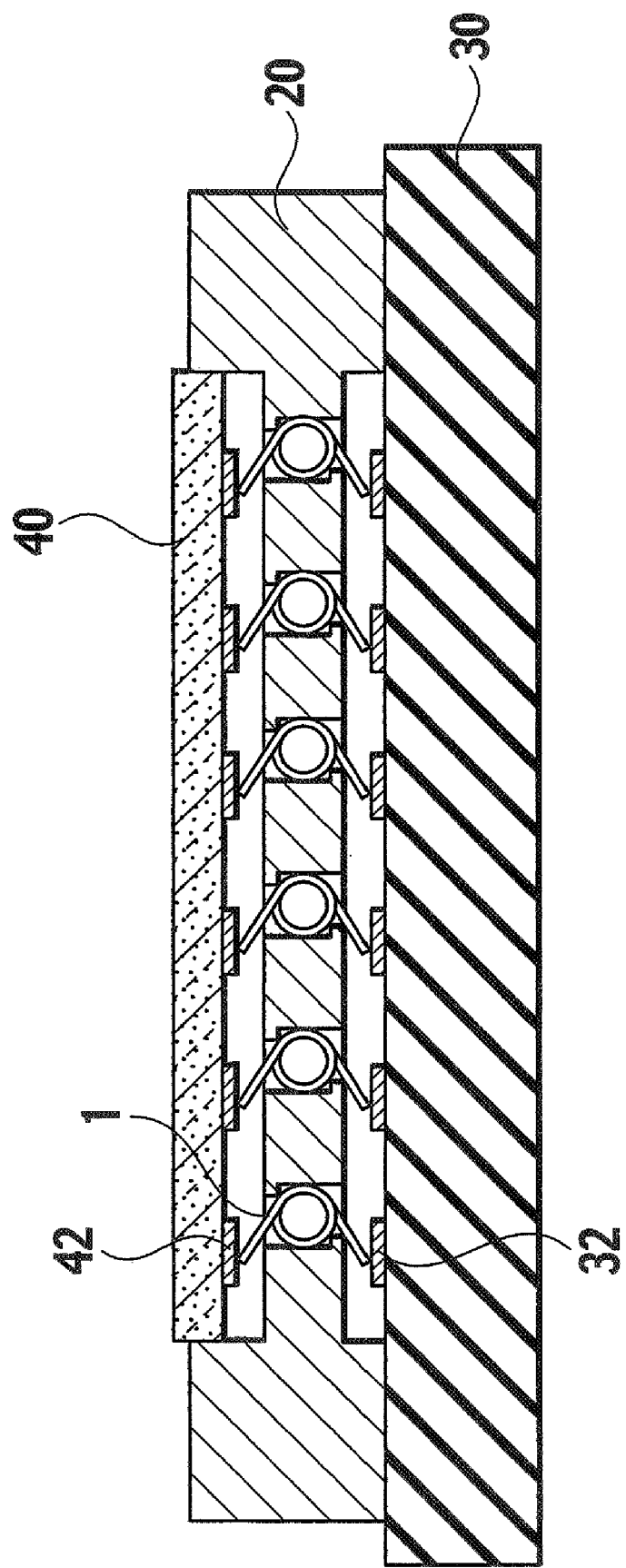
FIG. 8 is a view showing an IC package mounting device after the fitting operation of the IC socket according to the first embodiment of the present invention.

FIG. 8 shows an IC package mounting device after the fitting operation of the IC socket shown in FIGS. 7A to 7C. The IC package mounting device connects the IC package 40 to the printed circuit board 30 through the contacts 1 by disposing the IC socket between the IC package 40 and the printed circuit board 30 for mounting the IC package 40. In the IC package mounting device shown in FIG. 8, the housing 20 is vertically split into two pieces. Moreover, a location on the housing 20 for disposing the IC package 40 is provided with a step so as to allow positioning of the IC package 40.

Figure 9:
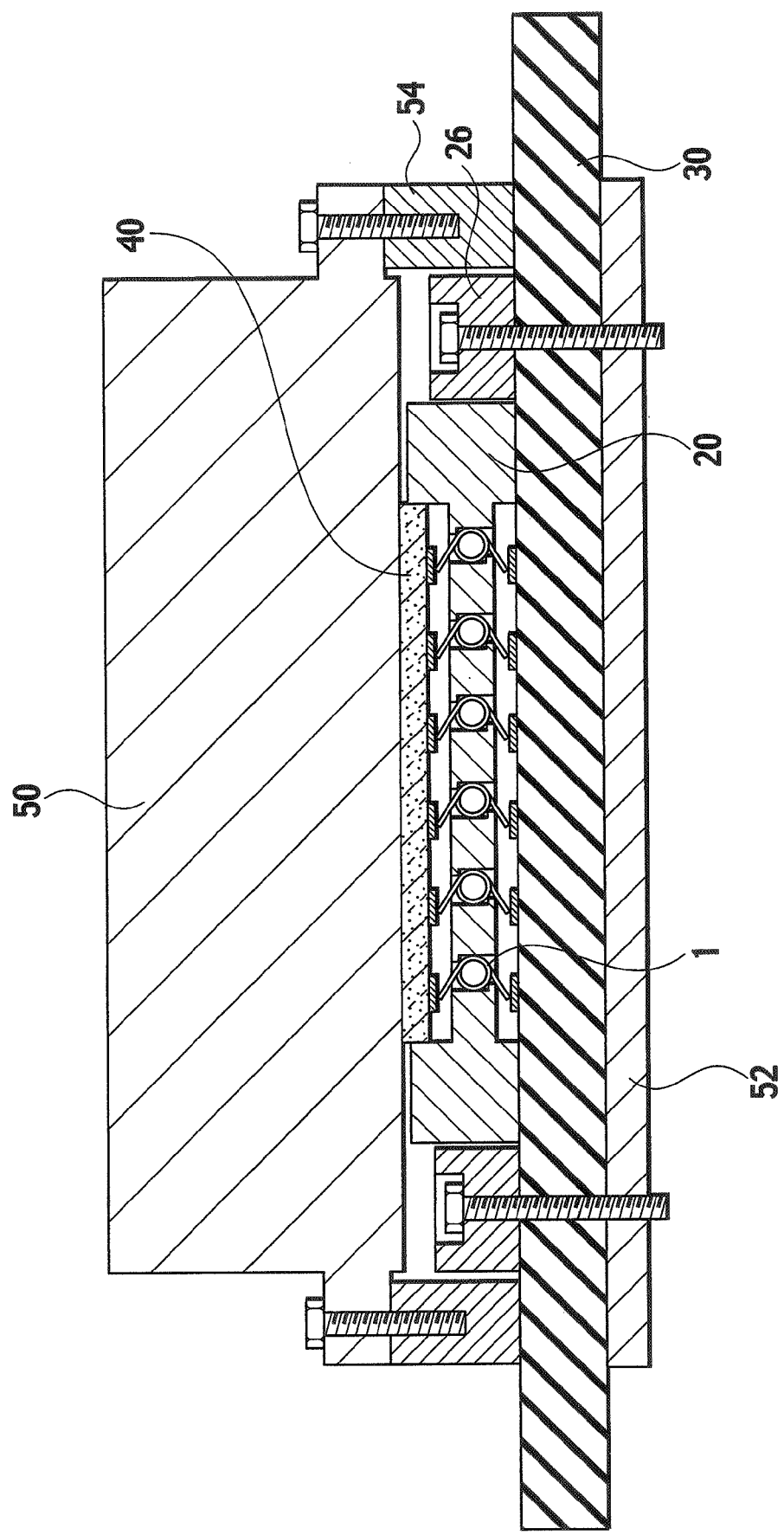
FIG. 9 is a first view showing the IC package mounting device configured to mount the IC package on the printed circuit board by use of the IC socket according to the first embodiment of the present invention.
Figure 10:
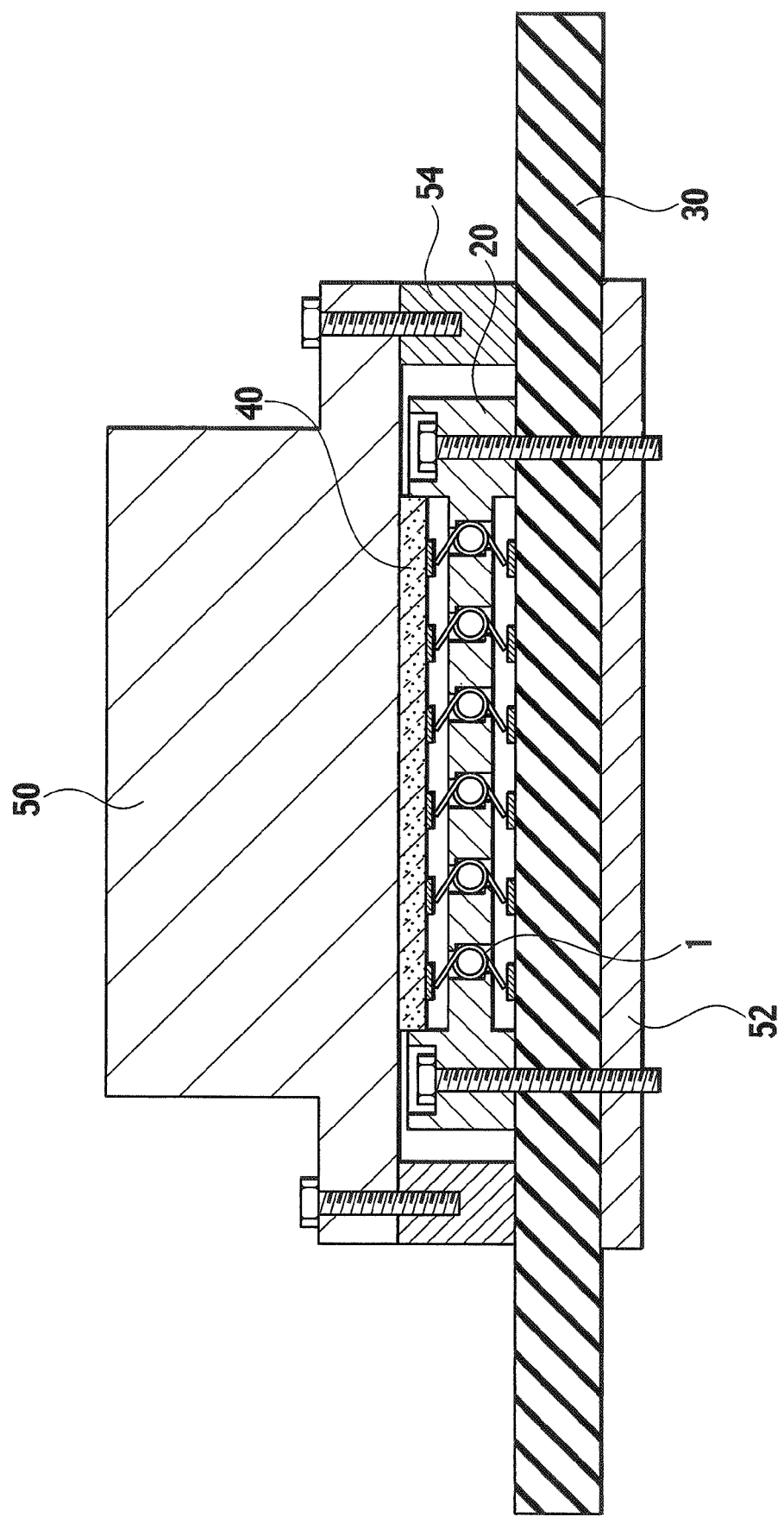
FIG. 10 is a second view showing the IC package mounting device configured to mount the IC package on the printed circuit board by use of the IC socket according to the first embodiment of the present invention.

FIG. 9 and FIG. 10 show examples of the IC package mounting device configured to mount the IC package 40 on the printed circuit board 30 by use of the IC socket according to the first embodiment of the present invention.

Housing guides 26 are fitted onto the printed circuit board 30 of the mounted device shown in FIG. 9. The housing guides 26 are fixed by use of a bottom plate 52 and fasteners such as screws. The housing guides 26 position the housing 20 of the IC socket when mounting the IC socket on the printed circuit board 30. A heat sink 50 for releasing heat generated from the IC package 40 is disposed in the vicinity of the IC package 40 that abuts on the contacts 1 of the IC socket. The heat sink 50 can be positioned and mounted on the printed circuit board 30 by fixation to bosses 54 using fasters such as screws.

The mounted device shown in FIG. 10 differs from the mounted device shown in FIG. 9 in that the housing guides 26 are not provided on the printed circuit board 30. Since there are no housing guides 26, the design of the housing 20 is arranged for achieving fixation to the printed circuit board 30 by use of fasteners such as screws. Other features of this device are substantially similar to the mounted device shown in FIG. 9 and duplicate explanation will be omitted herein.

The IC socket according to the first embodiment shown in FIG. 9 and FIG. 10 employs the structure including the contacts 1 that enable double-sided contact. Accordingly, it is possible to replace the contacts 1 together with the housing 20 for the purpose of maintenance. In the maintenance of the mounted device shown in FIG. 9, fasteners for fixing the heat sink 50 are unfastened first, then the IC package 40 is detached, and then the IC socket is replaced. Meanwhile, in the maintenance of the mounted device shown in FIG. 10, fasteners for fixing the heat sink 50 are unfastened first, then the IC package 40 is detached, then the fasters for fixing the housing 20 are unfastened, and then the IC socket is replaced. This maintenance is carried out regularly in server use where operational stability is vital. For that, the IC socket according to the first embodiment is applicable to the server use. When the mounted device in FIG. 9 is compared with the mounted device in FIG. 10, the IC package 40 and the IC socket are detachable at the same time after detaching the heat sink 50 in the case of the mounted device FIG. 9. Accordingly, it is preferable to provide the housing guides 26 as shown in FIG. 9 as far as the mounting space is available.

As described above, according to the IC socket of the first embodiment, by using the torsion springs as the contacts, it is possible to adjust various parameters including the wire diameter, the average winding radius, the effective winding number, and the an arm length without causing deterioration in productivity. Consequently, it is easier to improve the design freedom and to meet required mechanical characteristics. Moreover, as the compressed spring 12 is inserted into the contact insertion hole 22, the coil portions of the spring 12 come into contact with each other and is electrically conductive in the shortest distance to achieve connection at low inductance. Accordingly, this IC socket can correspond to the demands for the IC package of more pins, a finer pitch, a larger current and higher speed. Further, the contacts 1 apply the structure that enables double-sided contact by means of the torsion springs. Thus, the IC socket is easily replaceable and has an excellent feature in maintenance which is essential for the server use. In addition, as the oxide films formed on the surfaces of the terminals and the like are removed by the wiping effect, it is possible to realize contacts between fresh metal surfaces and thereby to keep the contact resistance low.

Second Embodiment

Figure 11A:
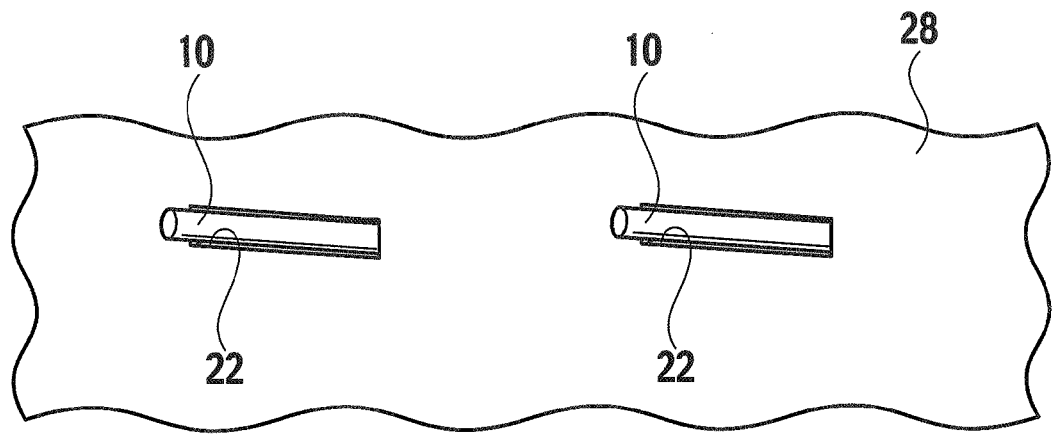
FIG. 11A is a schematic plan view of an IC socket according to a second embodiment of the present invention and FIG. 11B is a schematic cross-sectional view of the IC socket according to the first embodiment of the present invention.
Figure 11B:
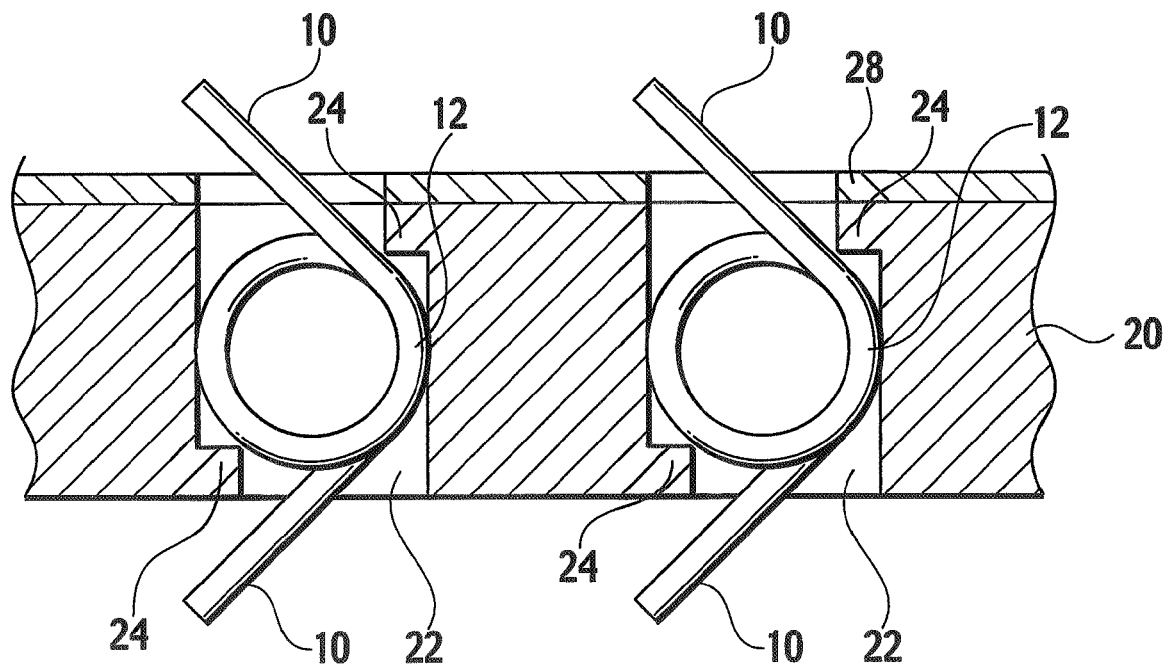

As shown in FIGS. 11A and 11B, an IC socket according to a second embodiment of the present invention is different from the IC socket of the first embodiment shown in FIGS. 2A and 2B only in that a housing lid 28 is provided on the housing 20 so as to cover the springs 12 while allowing only the arms 10 to expose. Other features of this IC socket are substantially similar to the IC socket of the first embodiment and duplicate explanation will be omitted herein.

The housing lid 28 prevents the contacts 1 from dropping off the contact insertion holes 22. Moreover, the housing lid 28 prevents breakages of the springs 12 at the time of handling. Although the housing lid 28 is provided only on one surface of the housing 20 in FIGS. 11A and 11B, it is also possible to provide the housing lids 28 on both surfaces thereof.

According to the IC socket of the second embodiment, it is possible to prevent the contacts 1 from dropping off and to prevent breakage of the springs 12 by providing the housing lid 28. Therefore, it is possible to improve durability and reliability of the IC socket.

Other Embodiment

Although the present invention has been described with reference to certain embodiments, it is to be understood that the description and drawings constituting part of this disclosure will not limit the scope of this invention. It is obvious to those skilled in the art that various alternative embodiments, examples, and technical applications are possible from the teachings of this disclosure.

The embodiment discloses that the tip ends of the arms 10 of the contact 1 have the wiping effect. The most important feature of the wiping effect is removal of the oxide films on the metal surfaces. In this context, it is possible to remove the oxide films more effectively when the tip end shape is sharper. However, the sharper tip end shape is more likely to damage the terminals on the printed circuit board 30 and the IC package 40. Moreover, the degree of removal of the oxide films also varies depending on the design of the degree of contact pressure between the arms 10 and the terminals. Here, it is possible to remove the oxide films more effectively when the contact pressure is higher. Therefore, the IC socket having low contact pressure should be equipped with the arms 10 having a sharper tip end shape. On the contrary, it is necessary to design the tip end shape so as not to cause excessive damage to the terminals in the case of the IC socket having high contact pressure.

Figure 12:
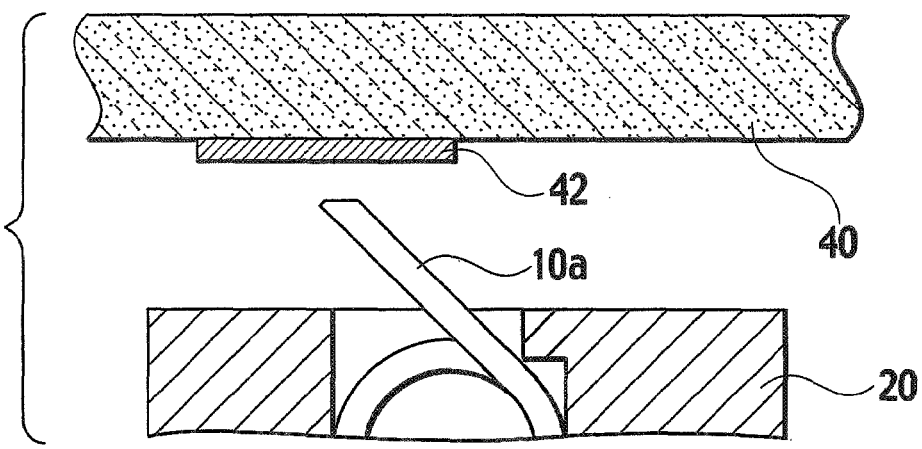
FIG. 12 is a first view showing a tip shape of an arm of an IC socket according to another embodiment of the present invention.
Figure 13:
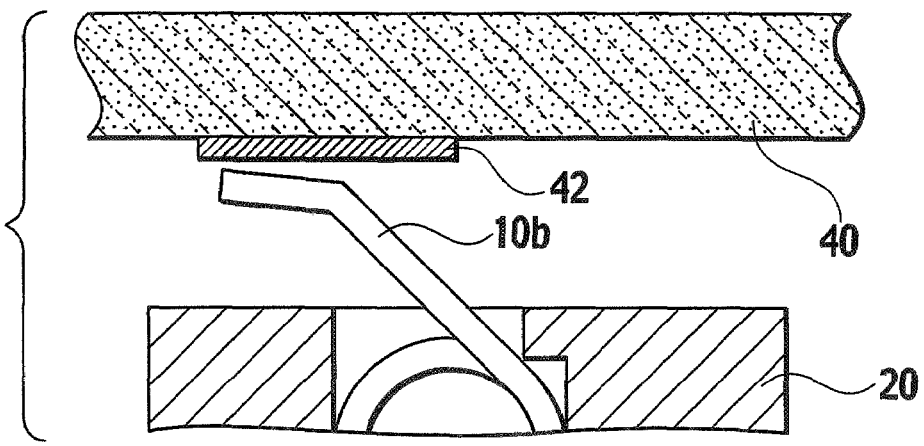
FIG. 13 is a second view showing a tip shape of an arm of an IC socket according to another embodiment of the present invention.
Figure 14:
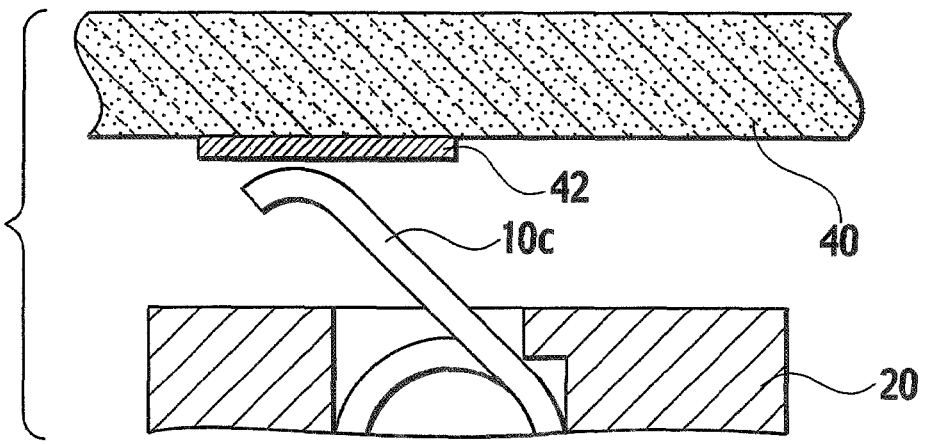
FIG. 14 is a third view showing a tip shape of an arm of an IC socket according to another embodiment of the present invention.

Accordingly, it is preferable to design an appropriate tip end shape in order to avoid excessive damage to the terminals with the IC socket having the high contact pressure. For example, as shown in FIG. 12, a tip end of an arm 10a may be formed into a chamfered shape. Meanwhile, as shown in FIG. 13, a tip end of an arm 10b may be formed into a bent shape. Alternatively, as shown in FIG. 14, a tip end of an arm 10c may be formed into a curved shape.

Various modifications will become possible for those skilled in the art after receiving the teachings of the present disclosure without departing from the scope thereof.

What is claimed is:

1. An IC socket comprising:
a plurality of contacts, each contact including a spring formed by winding a conductive material around a winding axis with an effective winding number of at least 1 round, and each contact further comprising arms provided on both ends of the spring; and
a housing including a plurality of holes, the holes each having one of the contacts inserted therein in a state in which the spring is compressed in a direction of the winding axis so as to allow adjacent coil portions in the spring to come into contact with each other, such that an electrical path across the spring is shorter when the spring is compressed than when it is not compressed,
wherein each contact works as a torsion spring when the spring is compressed, and
wherein the electrical path across the spring when the spring is compressed passes through at least a portion of each of the spring coils.

2. The IC socket of claim 1, wherein the contact is made of a metal wire rod.

3. The IC socket of claim 1, wherein the contact is made of a resilient material provided with metal plating.

4. The IC socket of claim 1, wherein the contact has a circular cross-sectional shape.

5. The IC socket of claim 1, wherein the contact has a rectangular cross-sectional shape.

6. The IC socket of claim 1, wherein a tip end of at least one of the arms has a chamfered shape.

7. The IC socket of claim 1, wherein a tip end of at least one of the arms has a bent shape.

8. The IC socket of claim 1, wherein a tip end of at least one of the arms has a curved shape.

9. The IC socket of claim 1, wherein at least one of the contact insertion holes is provided with a stopper configured to help secure the contact inserted in the at least one contact insertion hole provided with the stopper.

10. The IC socket of claim 1, wherein the housing further comprises a housing lid configured to cover the springs while allowing the arms to be exposed.

11. An IC package mounting device comprising:
an IC package;
a printed circuit board configured to mount the IC package; and an IC socket which includes:
- a plurality of contacts, each contact including a spring formed by winding a conductive material around a winding axis with an effective winding number of at least 1 round, and each contact further comprising arms provided on both ends of the spring; and
- a housing comprising a plurality of holes, the holes each having one of the contacts inserted therein in a state in which the spring is compressed in a direction of the winding axis so as to allow adjacent coil portions of the spring to come into contact with each other, such that an electrical path across the spring is shorter when the spring is compressed than when it is not compressed, and
- which the IC socket is disposed between the IC package and the printed circuit board to connect the IC package to the printed circuit board through the contacts,
wherein each contact works as a torsion spring when the spring is compressed and
wherein the electrical path across the spring when the spring is compressed passes through at least a portion of each of the spring coils.

12. The IC package mounting device of claim 11, wherein the printed circuit board further comprises a housing guide configured to position the IC socket.

13. The IC package mounting device of claim 11, wherein the contact is made of a metal wire rod.

14. The IC package mounting device of claim 11, wherein the contact is made of a resilient material provided with metal plating.

15. The IC package mounting device of claim 11, wherein a tip end of at least one of the arms has a chamfered shape.

16. The IC package mounting device of claim 11, wherein a tip end of at least one of the arms has a bent shape.

17. The IC package mounting device of claim 11, wherein a tip end of at least one of the arms has a curved shape.

18. The IC package mounting device of claim 11, wherein at least one of the contact insertion holes is provided with a stopper configured to help secure the contact inserted in the at least one contact insertion hole provided with the stopper.

19. The IC package mounting device of claim 11, wherein the housing further comprises a housing lid configured to cover the springs while allowing the arms to be exposed.

20. An IC socket comprising:
a housing comprising a plurality of holes;
a plurality of contacts, each contact being inserted into one of the plurality of holes;
wherein each contact comprises a spring formed by winding a wire around a winding axis each spring having an effective winding number of at least 1 round,
wherein each contact further comprises arms provided on both ends of the spring;
wherein each of the contacts has an uncompressed state in which adjacent coils of the springs are separated and a compressed state in which the adjacent coils are in contact with each other;
wherein an electrical path across each of the contacts is shorter when the contact is in a compressed state than when the contact is in an uncompressed state;
wherein an inductance of the contacts in the uncompressed state is higher than an inductance of the contacts in the compressed state; and
wherein the contacts and the holes are configured such that the contacts are in the compressed state when they are inserted into the holes,
wherein each contact works as a torsion spring when the spring is compressed, and
wherein the electrical path across the spring when the spring is compressed passes through at least a portion of each of the spring coils.

* * * * *